(12) United States Patent
Gao et al.

(10) Patent No.: US 11,454,742 B2
(45) Date of Patent: Sep. 27, 2022

(54) DECORATIVE SHEET, ELECTRONIC APPARATUS COVER PLATE AND ELECTRONIC APPARATUS

(71) Applicant: Shine Optoelectronics (Kunshan) Co., Ltd., Kunshan (CN)

(72) Inventors: Yulong Gao, Kunshan (CN); Su Shen, Kunshan (CN)

(73) Assignee: SHINE OPTOELECTRONICS (KUNSHAN) CO., LTD., Kunshan (CN)

( * ) Notice: Subject to any disclaimer, the term of this patent is extended or adjusted under 35 U.S.C. 154(b) by 973 days.

(21) Appl. No.: 16/205,153

(22) Filed: Nov. 29, 2018

(65) Prior Publication Data

US 2019/0110370 A1    Apr. 11, 2019

Related U.S. Application Data

(63) Continuation of application No. PCT/CN2017/084915, filed on May 18, 2017.

(51) Int. Cl.
*G02B 1/14*    (2015.01)
*G02B 5/09*    (2006.01)
(Continued)

(52) U.S. Cl.
CPC .............. *G02B 1/14* (2015.01); *G02B 5/09* (2013.01); *G02B 5/10* (2013.01); *G02B 30/26* (2020.01);
(Continued)

(58) Field of Classification Search
CPC .......... G02B 1/14; G02B 5/10; H05K 5/0243; H05K 5/03
(Continued)

(56) References Cited

U.S. PATENT DOCUMENTS 10,696,091 B2 * 6/2020 Zhang .................. B32B 7/12
10,823,978 B2 * 11/2020 Zhang .............. B29D 11/00298
(Continued)

FOREIGN PATENT DOCUMENTS

CN        1813262 A       8/2006
CN     101850680 A  *  10/2010
(Continued)

OTHER PUBLICATIONS

International Search Report Issued in International Application No. PCT/CN2017/084915, Entitled "Decorative Member, Cover Plate for Electronic Apparatus, and Electronic Apparatus", Date of Mailing of Search Report: dated Aug. 15, 2017.
(Continued)

*Primary Examiner* — Ricky D Shafer
(74) *Attorney, Agent, or Firm* — Hamilton, Brook, Smith & Reynolds, P.C.

(57)    ABSTRACT

The present invention discloses a decorative sheet, an electronic apparatus cover plate and an electronic apparatus. The decorative sheet is used for forming a three-dimensional image to represent a three-dimensional material object. The decorative sheet comprises a transparent protective layer, a graph-text structure layer and a reflective layer; the graph-text structure layer and the reflective layer are located on a same side of the transparent protective layer; the graph-text structure layer comprises a number of graph-text sub-blocks which form the three-dimensional image and each of which comprises a micro-structure that represents corresponding lightness of the three-dimensional material object. The lightness of light rays emitted by each graph-text sub-block comprising the micro-structure is different, and thus a change of lightness is produced among the graph-text sub-blocks. By using the lightness change among the graph-text sub-blocks to represent the lightness change of the three-
(Continued)

dimensional material object in a natural state, the graphs and text displayed on the graph-text structure layer are enabled to have a three-dimensional effect.

20 Claims, 11 Drawing Sheets

(51) Int. Cl.
- *G02B 30/26* (2020.01)
- *G02B 30/27* (2020.01)
- *G02B 5/10* (2006.01)
- *H05K 5/02* (2006.01)
- *H05K 5/03* (2006.01)

(52) U.S. Cl.
CPC .......... *G02B 30/27* (2020.01); *H05K 5/0243* (2013.01); *H05K 5/03* (2013.01)

(58) Field of Classification Search
USPC ........................................................ 359/507
See application file for complete search history.

(56) References Cited

U.S. PATENT DOCUMENTS

| | | | |
|---|---|---|---|
| 11,143,794 B2* | 10/2021 | Zhang | B42D 25/342 |
| 2004/0140665 A1* | 7/2004 | Scarbrough | B44F 1/10 |
| | | | 283/95 |
| 2005/0219626 A1* | 10/2005 | Moncrieff | B44C 1/105 |
| | | | 358/3.12 |
| 2005/0260386 A1 | 11/2005 | Heinrich et al. | |
| 2007/0058260 A1* | 3/2007 | Steenblik | B42D 25/328 |
| | | | 359/626 |
| 2010/0084851 A1* | 4/2010 | Schilling | B42D 25/29 |
| | | | 283/91 |
| 2011/0122499 A1* | 5/2011 | Commander | B44F 1/045 |
| | | | 359/626 |
| 2011/0159243 A1 | 6/2011 | Ahn et al. | |
| 2012/0146323 A1* | 6/2012 | Schilling | B42D 25/00 |
| | | | 283/85 |
| 2014/0205814 A1* | 7/2014 | Hwang | B44C 1/1712 |
| | | | 428/195.1 |
| 2015/0298482 A1* | 10/2015 | Walter | G02B 5/1852 |
| | | | 359/572 |
| 2017/0313121 A1* | 11/2017 | Schilling | B42D 25/24 |
| 2018/0284330 A1* | 10/2018 | Parker | G02B 5/0816 |

FOREIGN PATENT DOCUMENTS

| | | |
|---|---|---|
| CN | 102179962 A | 9/2011 |
| CN | 102470658 A | 5/2012 |
| CN | 103309047 A | 9/2013 |
| CN | 104786687 A | 7/2015 |
| CN | 1684843 A | 10/2015 |
| CN | 205902240 U | 1/2017 |
| CN | 205902241 U | 1/2017 |
| EP | 2907669 A1 | 8/2015 |

OTHER PUBLICATIONS

Examination Report for Indian Application No. 201827048456, entitled "Decorative Sheet, Electronic Apparatus Cover Plate and Electronic Apparatus," consisting of 5 pages, dated Aug. 24, 2020.
Chinese Search Report dated Apr. 30, 2019 in Application No. 2016103820158 (English Translation provided).

* cited by examiner

DECORATIVE SHEET, ELECTRONIC APPARATUS COVER PLATE AND ELECTRONIC APPARATUS

CROSS REFERENCE TO RELATED APPLICATIONS

This application is a Continuation of International Application No. PCT/CN2017/084915, which designates the United States and was filed on May 18, 2017, published in Chinese, which claims priority to Chinese Patent Application No. 201610379546.1, entitled "Decorative Sheet, Electronic Apparatus Cover Plate and Electronic Apparatus", filed on May 31, 2016 and to Chinese Patent Application No. 201610382015.8, entitled "Decorative Sheet, Electronic Apparatus Cover Plate and Electronic Apparatus", filed on Jun. 1, 2016. The entire teachings of the above applications are incorporated herein by reference.

TECHNICAL FIELD

The present invention relates to the field of optical thin films, in particular to a decorative sheet, an electronic apparatus cover plate and an electronic apparatus.

BACKGROUND

With the continuous development of science and technology, decorative sheets are widely used on the surfaces of electronic products such as cell phones and computers, household appliances such as refrigerators, air conditioners and washing machines and automobiles, in order to improve the aesthetic property of the products.

In the prior art, an intaglio printing technique is generally employed in making decorative sheets, which is, printing a graph-text structure layer having patterns or characters inside a film to thereby present various ornamental patterns or metallic feelings. However, the graph-text structure layer fabricated by the intaglio printing technique is usually a planar structure and cannot present a three-dimensional effect. Moreover, the graph-text structure layer fabricated by the intaglio printing technique has poor resolution, which makes the displayed graphs and text unclear.

In addition, in order to make the graphs and text of the decorative sheet bright and eye-catching so as to enable a user to see clearer and brighter graphs and text, in the prior art, in general, brightening inks will be used in intaglio printing, or shinning crystals will be added in the graph-text structure layer, such that the graphs and text of a device film will appear to be bright and eye-catching. However, the manufacture process will involve certain difficulty and material waste, which will increase the cost to a certain extent. The brightening inks will also cause pollutions to the environment. In addition, if the above materials are used to enhance the definition and lightness of the graphs and text, the longer the materials are used, the greater the oxidation degree of the materials will be, and as time passes the definition and lightness of the graphs and text will also decrease correspondingly.

SUMMARY

With respect to the above problem, the present invention is aimed at providing a decorative sheet, for forming a three-dimensional image to represent a three-dimensional material object. The decorative sheet comprises a transparent protective layer, a graph-text structure layer and a reflective layer. The graph-text structure layer and the reflective layer are located on a same side of the transparent protective layer. The graph-text structure layer comprises a number of graph-text sub-blocks which form the three-dimensional image, and each graph-text sub-block comprises a micro-structure that represents corresponding lightness of the three-dimensional material object.

Preferably, light rays reflected or refracted by the micro-structure to the graph-text sub-block represent the corresponding lightness of the three-dimensional material object.

Preferably, each graph-text sub-block represents the corresponding lightness of the three-dimensional material object based on a location of a light source.

Preferably, each graph-text sub-block represents the corresponding lightness of the three-dimensional material object based on a location of a receptor.

Preferably, the lightness of the image formed by the graph-text structure layer is related to one or a combination of two of a size, a shape, a spacing distance, a period, a height, arrangement density, material and an included angle with a horizontal direction of the graph-text sub-blocks.

Preferably, the lightness of the image formed by the graph-text structure layer is related to one or a permutation and combination of two or more of a size, a shape, a spacing distance, a period, a height, arrangement density, material and an included angle with a horizontal direction of the micro-structures.

Preferably, a lightness change of the image formed by every graph-text sub-block conforms to a lightness change of the three-dimensional material object.

Preferably, the included angles between the micro-structures in at least two graph-text sub-blocks and the horizontal direction are different, so that a dynamic and continuous image of the three-dimensional material object is obtained.

Preferably, the micro-structure is a convex structure and/or a concave structure.

Preferably, in a same graph-text sub-block, the graph-text sub-block comprises a plurality of identical micro-structures.

Preferably, a maximum radius of the graph-text sub-block is less than 100 µm; or the maximum radius of the graph-text sub-block is less than 80 µm; or the maximum radius of the graph-text sub-block is less than 50 µm.

Preferably, a cross-sectional shape of the graph-text sub-block includes round, triangular, square, rectangular and irregular polygonal shapes;

or a cross-sectional shape of the micro-structure includes round, triangular, square, rectangular and irregular polygonal shapes.

Preferably, a setting of plural micro-structures forms the image, and a change among the plural micro-structures represents the lightness change of the image.

Preferably, a change in one or more of the size, shape, spacing distance, period, height, arrangement density, material and included angle with the horizontal direction of the micro-structures represents the lightness of the image.

Preferably, a gray value of the three-dimensional material object presented at a predetermined angle corresponds to the setting of the plural micro-structures, one gray value corresponds to one micro-structure, the micro-structures are the same when the gray values are the same, and the micro-structures are different when the gray values are different.

Preferably, a spacing distance between two closely adjacent graph-text sub-blocks is from 0 to 200 µm; or the spacing distance between two closely adjacent graph-text sub-blocks is from 0 to 50 µm.

Preferably, the graph-text structure layer is provided between the transparent protective layer and the reflective layer.

Preferably, a face of the graph-text structure layer which has the micro-structures is facing towards the transparent protective layer.

Preferably, a bonding layer is also provided between the transparent protective layer and the graph-text structure layer.

Preferably, there is a refractive index difference between the bonding layer and the micro-structure.

Preferably, the decorative sheet further comprises a bearing layer and a polymer layer, the polymer layer is provided on a side of the bearing layer, and the graph-text sub-blocks are provided on the polymer layer.

Preferably, the reflective layer is located between the transparent protective layer and the graph-text structure layer.

Preferably, the reflective layer is located between the bearing layer and the polymer layer.

Preferably, the decorative sheet comprises a coloring layer which is provided on a surface of the reflective layer.

Preferably, the decorative sheet comprises a coloring layer, which is provided between the polymer layer and the bearing layer.

The present invention also provides an electronic apparatus cover plate, which is provided with a decorative sheet as described above.

The present invention further provides an electronic apparatus, which is provided with an electronic apparatus cover plate as described above.

Preferably, the electronic apparatus comprises consumer electronics and household appliances.

Advantageous effects of the present invention are as follows:

(1) The present invention provides a decorative sheet, which comprises a graph-text structure layer, the graph-text structure layer comprises a number of graph-text sub-blocks, and the graph-text sub-blocks in turn comprise a number of micro-structures. The parameters of the micro-structures of each graph-text sub-block are different, so that light rays emitted by each graph-text sub-block comprising the micro-structures have different lightness, and thus a change of lightness is produced among the graph-text sub-blocks. By using the lightness change among the graph-text sub-blocks to represent the lightness change of the three-dimensional material object in a natural state, the graphs and text displayed on the graph-text structure layer are enabled to have a three-dimensional effect.

(2) The present invention provides a decorative sheet. By adjusting the parameters of the micro-structures in the graph-text sub-blocks on the decorative sheet, an oriented brightness of the graph-text structure layer is enhanced, and graphs and text of different brightness can be presented when the observer observes the graphs and text from different visual angles.

(3) The present invention provides a decorative sheet, in which the graph-text structure layer is formed of graph-text sub-blocks. By adjusting the arrangement density and diameter of the graph-text sub-blocks, the graphs and text displayed on the graph-text structure layer are enabled to have higher resolution. No matter from which angle the observer observes the decorative sheet, the observer can see clearer graphs and text. In addition, the graphs and text have a visually continuous and three-dimensional effect, giving the observer a sense of reality, thereby achieving a good decorative effect.

(4) The present invention provides a decorative sheet, wherein the brightness of the graphs and text are adjusted by using the micro-structures, and no brightening ink or other material needs to be used, which saves costs and produces no pollution to the environment.

10. Graph-text structure; 11. Enlarged view; 20. Graph-text sub-block; 21. Graph-text sub-block; 22. Graph-text sub-block; 30. Bearing body or substrate material; 31. Micro-structure; 32. Polymer layer; 33. Micro-structure; 34.

Blank region; 41. Reflective layer; 42. Coloring layer; 51. Transparent protective layer; 52. Bonding layer.

DETAILED DESCRIPTION

To facilitate the understanding of the present invention, the following will make a more comprehensive description to the present invention with reference to the relevant accompanying drawings. The accompanying drawings provide preferred embodiments of the present invention. However, the present invention can be implemented in various different forms and is not limited to the embodiments described below. On the contrary, the purpose of providing these embodiments is to enable a more thorough and comprehensive understanding of the contents disclosed by the present invention.

What needs to be explained is that when an element is referred to as being "provided on" another element, it can be directly on the other element, or an intervening element may also exist. When an element is referred to as being "connected to" another element, it can be directly connected to the other element, or an intervening element may also exist at the same time. The terms "vertical", "horizontal", "left", "right" and similar expressions in this text are used for the purpose of explanation only, and do not represent the unique embodiment.

Unless otherwise defined, all technical and scientific terms used in this text have the same meaning as commonly understood by the skilled persons in the technical field of the present invention. The terms used in the Description of the present invention are for the purpose of describing the specific embodiments only, and are not intended to limit the present invention. The term "and/or" used in this text includes any and all combinations of one or more of the associated listed items.

The present invention discloses a decorative sheet, for forming a three-dimensional image to represent a three-dimensional material object. The decorative sheet comprises a transparent protective layer 51, a graph-text structure layer and a reflective layer 41; the graph-text structure and the reflective layer 41 are located on a same side of the transparent protective layer 51; the graph-text structure layer comprises a number of graph-text sub-blocks 20 which form the three-dimensional image and each of which comprises a micro-structure 31 that represents the corresponding lightness of the three-dimensional material object.

Figure 1A:
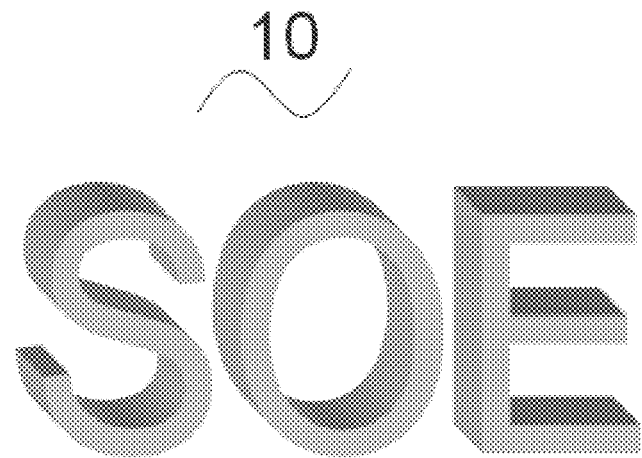
FIG. 1a is a structural diagram of a micro-structure type graph-text structure in a decorative sheet of the present invention.
Figure 1B:
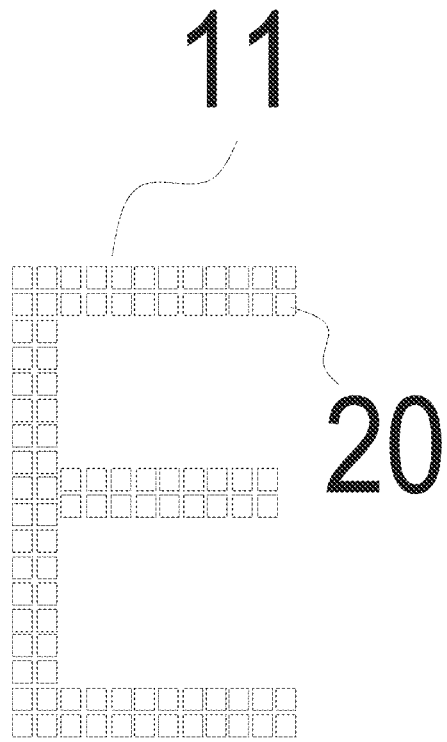
FIG. 1b is a partially enlarged structural diagram of the micro-structure type graph-text structure in a decorative sheet of the present invention.

In this embodiment, the decorative sheet can be used to display characters or patterns having a three-dimensional effect. Please refer to FIG. 1a, the decorative sheet comprises a graph-text structure 10 on which three-dimensional letters "SOE" can be displayed. From an angle perpendicular to the paper, the letters "SOE" give the observer a stereoscopic visual experience through a change of lightness in different areas thereof. Please refer to FIG. 1b specifically, which is a planar enlarged view 11 of the letter "E" in "SOE". The enlarged view 11 includes a number of graph-text sub-blocks 20, wherein different graph-text sub-blocks 20 can have different lightness according to the graphs and text need to be displayed. Referring to FIGS. 1a and 1b, the graph-text sub-blocks 20 on the top line of the letter "E" in FIG. 1b are darker than that on the next line, and thus the three-dimensional effect as shown in FIG. 1a can be displayed. The graph-text sub-blocks 20 in the other areas are similar and thus will not be described here anymore.

Please refer to FIG. 1b continuously. In the prior art, the resolution or definition of a picture is related to the density and arrangement manner of the pixel points thereof. The picture is clearer when the pixel points are arranged more densely. In order to make the graphs and text on the decorative sheet clearer and easier to be observed by the observer, in this embodiment, the graph-text sub-blocks 20 can be similar to the pixel points, namely, the graphs and text on the decorative sheet is displayed more clearly when the graph-text sub-blocks 20 are arranged more densely. To be specific, a spacing distance may exist between two closely adjacent graph-text sub-blocks 20, and a range of the spacing distance can be from 0 to 200 μm.

In a preferred embodiment, the spacing distance between two closely adjacent graph-text sub-blocks 20 can be from 0 to 100 μm. Further, the range of the spacing distance can be from 0 to 50 μm. Much further, the spacing distance can also be 5 μm, 10 μm, 15 μm, 20 μm, 25 μm, 30 μm or 40 μm. The present application does not make any specific limitation to the spacing distance between adjacent graph-text sub-blocks 20, and the spacing distance can be determined according to the required resolution and the continuity of the graphs and text.

More preferably, without considering the cost and processing difficulty, there can be no spacing distance between adjacent graph-text sub-blocks 20, so that the graph-text structure layer can display clearer graphs and text.

In this embodiment, the lightness of the image formed by the graph-text structure layer is also related to one or a combination of two of the size, shape, period, height, material and included angle with a horizontal direction of each graph-text sub-block 20, in addition to the arrangement density thereof. To be specific, in the field of optics, lightness is related to the factors such as the angle, strength and number of the light rays coming into the observer's eyes. By changing the above parameters among different graph-text sub-blocks 20 to thereby change the angle, strength and number of the light rays coming into the observer's eyes, the lightness is different among different graph-text sub-blocks 20, and thus the graphs and text are enabled to present a three-dimensional effect.

Please refer to FIGS. 7a~7e, which are diagrams illustrating the different cross-sectional shapes of the graph-text sub-blocks 20. To be specific, the cross-sectional shape of the graph-text sub-block 20 includes round, triangular, square, rectangular and irregular polygonal shapes. By setting the graph-text sub-blocks 20 of different shapes, the lightness of the image formed by the graph-text sub-blocks 20 is varied.

In a preferred embodiment, FIGS. 7a~7e can also be diagrams illustrating the cross section of the micro-structure 31 (micro-structures 33). The cross-sectional shape of the micro-structure 31 (micro-structures 33) includes round, triangular, square, rectangular and irregular polygonal shapes. By setting the micro-structures 31 (micro-structures 33) of different shapes, the lightness of the image formed by the micro-structures 31 (micro-structures 33) is varied.

More preferably, the lightness change of the image formed by the graph-text sub-blocks 20 conforms to the change of the three-dimensional material object. The lightness is different manifestations of light rays reflected by the micro-structures 31 in each graph-text sub-block 20 that enter the human eyes. Assume that the incident light source is constant, then the incident light (received light rays) of each graph-text sub-block 20 is the same. What is different is that, since the parameters of the micro-structure 31 in each graph-text sub-block 20 are different, causing the angles at which the light rays are reflected and refracted to be different, the number of light rays emitted by each graph-text sub-block 20 and received by the human eyes at a fixed position is also different, and thus the presented lightness is different.

Figure 2A:
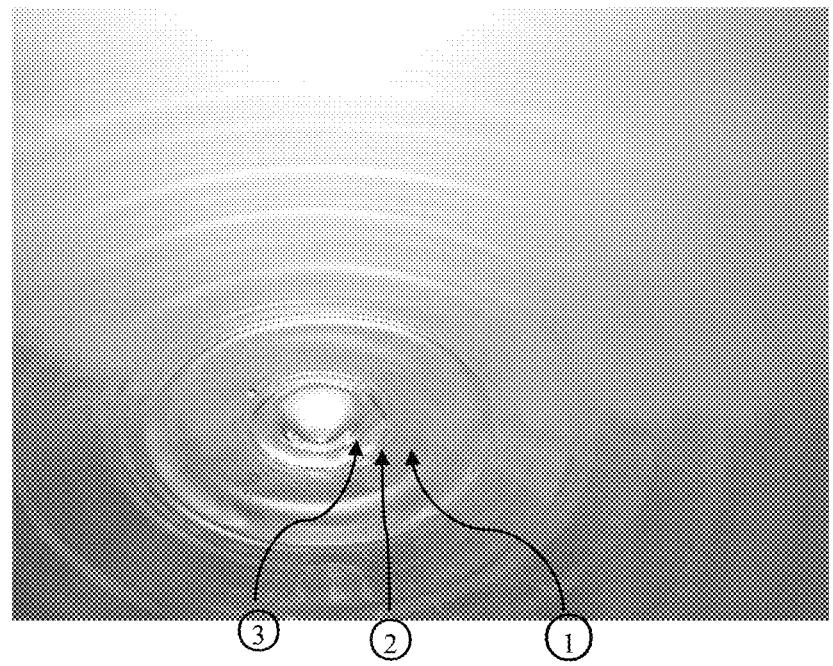
FIG. 2a is a structural diagram of another micro-structure type graph-text structure in a decorative sheet of the present invention.
Figure 2B:
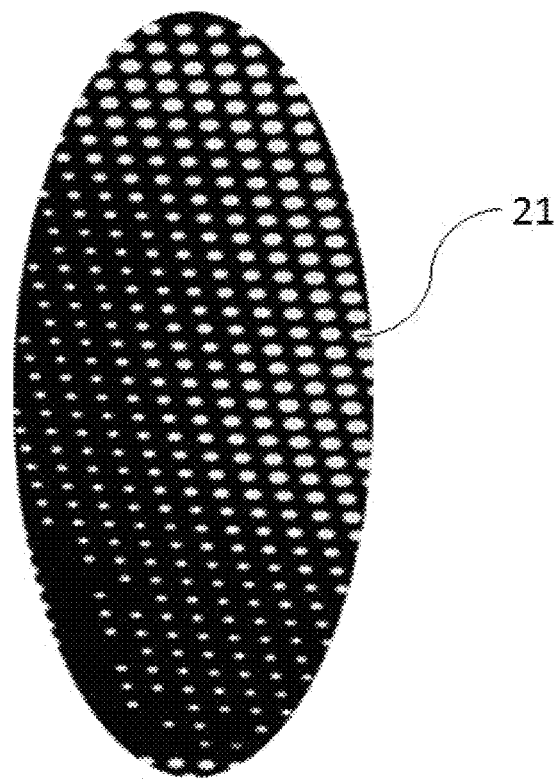
FIG. 2b is a locally enlarged diagram of another micro-structure type graph-text structure in a decorative sheet of the present invention.
Figure 2C:
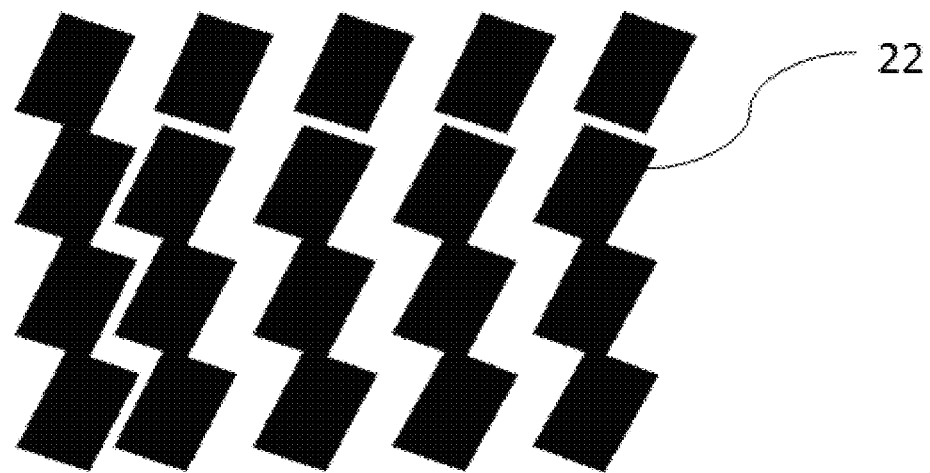
FIG. 2c is a diagram of another graph-text sub-block in another micro-structure type graph-text structure in a decorative sheet of the present invention.
Figure 3:
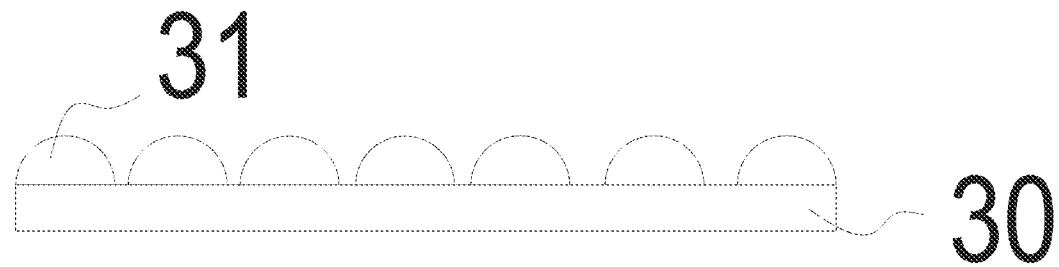
FIG. 3 is a diagram of the micro-structure of the present invention.

In this embodiment, combining FIGS. 2*a*~2*c* with FIG. 3, the graph-text sub-block 22 comprises a number of micro-structures 31 (not shown in the figure). The micro-structure 31 can be used to refract or reflect light rays received by the graph-text sub-block 22 and thereby emit light rays. To be specific, the observer's sense of lightness is formed by the angle and strength of the light rays coming into the observer's eyes. By changing the parameters of the micro-structures 31 to thereby change the angle and strength of the light rays that come into the observer's eyes, the graph-text sub-blocks 22 comprising the micro-structures 31 are allowed to have different lightness.

In a preferred embodiment, in a same graph-text sub-block 22, the graph-text sub-block 22 comprises a plurality of identical micro-structures.

In the decorative sheet provided in the present invention, as shown in FIG. 1*b*, the parameters of the micro-structures 31 of the graph-text sub-blocks 20 are different. When the same incident light rays are incident on different micro-structures 31, the angles and strengths of light reflected by the micro-structures 31 are different, such that the lightness of the light rays emitted by each graph-text sub-block 20 comprising the micro-structures 31 is different, and thus a change of lightness is produced among the graph-text sub-blocks 20. By using the lightness change among the graph-text sub-blocks 20 to represent the lightness change of the three-dimensional material object in a natural state, the graphs and text displayed on the graph-text structure layer are enabled to have a three-dimensional effect.

Please refer to FIG. 2*a*, which is a planar image that has a three-dimensional effect of a naturally formed water wave surface. Such a planar image having a three-dimensional effect can be applied to appearance decorations of electronic products such as cell phones and computers. The planar graphs and text having a three-dimensional effect at least comprise a dark region as region ① in the figure, a transition region as region ② in the figure and a light region as region ③ in the figure, wherein region ①, region ② and region ③ are successive regions, in other words, a gradually changing process from light to dark is presented, and thereby a three-dimensional effect is presented visually.

Please refer to FIG. 2*b*, which shows an enlarge view of the region ② in FIG. 2*a*. FIG. 2*b* consists of a number of graph-text sub-blocks 21, which are similar to the above graph-text sub-blocks 20 in function and structure and assigned with the different reference sign only for the convenience of expression.

As can be seen from FIG. 2*b*, region ① is a dark region. The graph-text sub-blocks 21 in region ① are arranged sparsely, in other words, the arrangement density of the graph-text sub-blocks 21 is low, and the diameters of individual graph-text sub-blocks 21 are small. As a result, this region is relatively darker. Similarly, region ③ is a light region. The graph-text sub-blocks 21 in this region are arranged compactly, and the diameters of individual graph-text sub-blocks 21 are relatively greater, so that the graph-text sub-blocks 21 in this region can reflect more light rays to the observer's eyes to make the observer feel that this region is brighter. By representing the naturally formed lightness change of the real three-dimensional material object, the graphs and text are enabled to form a three-dimensional effect.

In this embodiment, a maximum radius of the graph-text sub-block 21 can be less than 100 µm. The definition to the maximum radius is a circle of a minimum radius through which the graph-text sub-block 21 can pass. Preferably, the maximum radius of the graph-text sub-block 21 is less than 80 µm. More preferably, the maximum radius of the graph-text sub-block 21 is less than 50 µm. The present application does not make any specific limitation to the maximum radius of the graph-text sub-block 21, and the radius can be specifically selected according to the actually required display effect of the graphs and text.

Please refer to FIG. 2*c*, which is an enlarged view of a part region of FIG. 2*a*. The graphs and text are formed by another kind of graph-text sub-blocks 22. The range of the size of the graph-text sub-blocks 22 can be from 2 to 500 µm, or from 10 to 300 µm, or from 20 to 150 µm, and can be from 30 to 100 µm. The angles of the graph-text sub-blocks 22 are varied along with the different lightness on FIG. 2*a*.

To be specific, all the angles between the graph-text sub-blocks 22 can be different from each other, then as the angle of the observer is changed, the graph-text sub-block 22 of the same angle will enter the field of view of the observer, allowing the observer to have a vision disparity as if the graphs and text are moving when the angle of the observer is changed, and therefore, a dynamic and continuous image of the three-dimensional material object is obtained. On the other hand, different graph-text sub-blocks 22 have different angles, so that different graph-text sub-blocks 22 have different lightness change, and thereby the graphs and text are enabled to have a three-dimensional effect.

Figure 19:
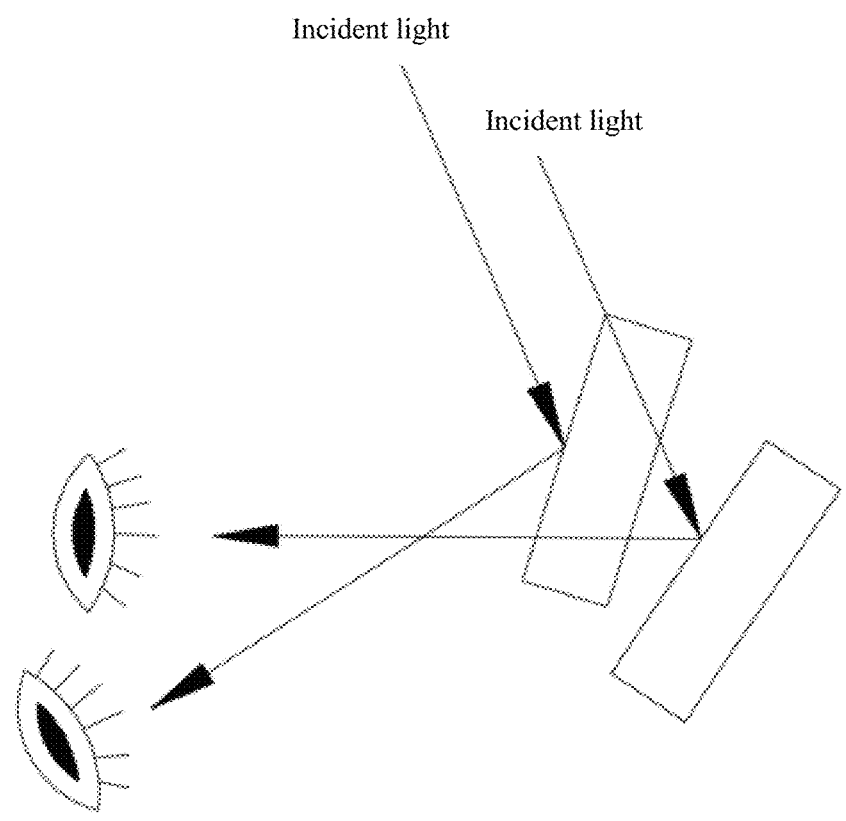
FIG. 19 is a diagram of the principle of the dynamic effect of the graphs and text in a decorative sheet of the present invention.

In a preferred embodiment, each graph-text sub-block 22 can emit light rays based on a location of a light source, such that the graph-text sub-block 22 based on the location illuminated by the light source is brighter than those which are not illuminated by the light source. To be specific, the angles and strengths in which different graph-text sub-blocks 22 are reflected to the observer's eyes are different when the location of the light source is different, and thus the graph-text sub-blocks 22 having different angles are allowed to have different lightness. As shown in FIG. 19, in the case of incidence of the same incident light, since the included angles between the micro-structures 31 in the graph-text sub-blocks 22 and the horizontal direction are different, when the location of the light source changes, the graph-text sub-blocks 22 emit light rays based on the location of the light source such that the place illuminated by the light rays appears to be brighter and brings an effect of material object to the observer.

In another preferred embodiment, each graph-text sub-block 22 can emit light rays based on a location of a receptor. In this way, the graph-text sub-blocks 22 at a position corresponding to the receptor can emit light rays or relatively more light rays. To be specific, by adjusting the parameters of the micro-structures 31 in the graph-text sub-blocks 22 on the decorative sheet, the oriented brightness of the graph-text structure layer is enhanced. When the observer is observing the graphs and text, the region which the observer is observed can emit light rays or relatively more light rays, so that the observer can observe bright graphs and text. When people shift their sight, the light rays reflected by the micro-structure 31 can also move visually, thus giving people a sense that the graphs and text have a dynamic effect. Meanwhile, the observer can observe the graphs and text which are brighter in a certain direction, and the oriented brightening effect is achieved without the use of lightening inks or other materials, which saves costs and produces no pollution to the environment.

In another preferred embodiment, a change rate of the lightness of the image formed by the graph-text structure layer which changes along with the change of the location of the receptor or light source conforms to the visual effect parameters of the three-dimensional material object, and thereby the three-dimensional material object is represented.

The lightness can be represented by gray values. In this embodiment, the gray value of the image formed by the graph-text structure layer is related to one or a permutation and combination of two or more of the size, shape, spacing distance, period, height, arrangement density, material and included angle with a horizontal direction of the micro-structures 31 (micro-structures 33).

Please refer to FIGS. 8a~8g, which show correspondence relationships between gray value and part of the above parameters. As long as the parameters of the micro-structures 31 correspond to the gray value of the graphs and text, the graph-text sub-blocks 22 comprising the micro-structures 31 are enabled to have different lightness, and thus the graphs and text on the graph-text structure layer are enabled to represent a three-dimensional effect.

To be specific, gray level data of each region of the material object is obtained by analyzing the object. According to the data, in combination with FIG. 2c, the parameters of the micro-structures 31 of each graph-text sub-block 22 are set correspondingly, such that the graph-text sub-blocks 22 comprising the micro-structures 31 are enabled to have different lightness, and thus a three-dimensional effect is achieved. For example, the heights of the micro-structures 31 are set according to the gray value, the heights of the micro-structures 31 of each graph-text sub-block 22 are consistent, the height value represents the gray level of the corresponding region of the material object, and each graph-text sub-block 22 has a different height. Thus, the change of lightness is achieved and finally the three-dimensional effect is realized.

Figure 8A:
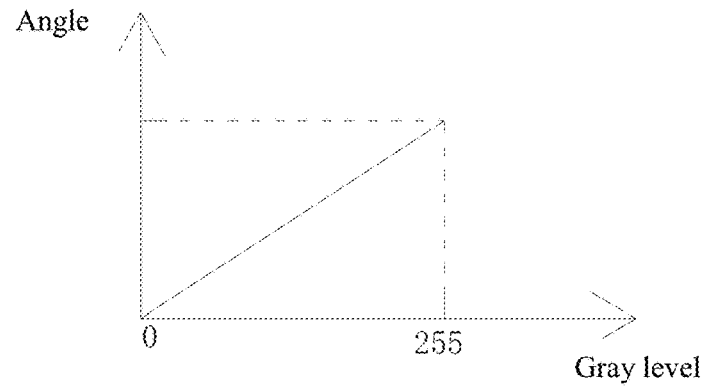
FIGS. 8a~8g are diagrams of the relationships between gray value and the structural parameters of the micro-structure in the graph-text sub-block of the present invention.
Figure 8B:
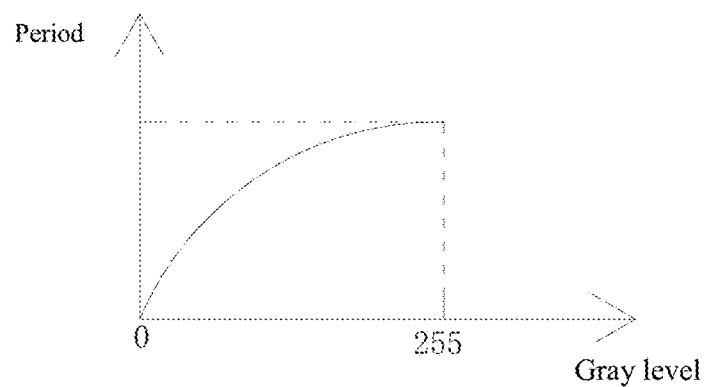
Figure 8C:
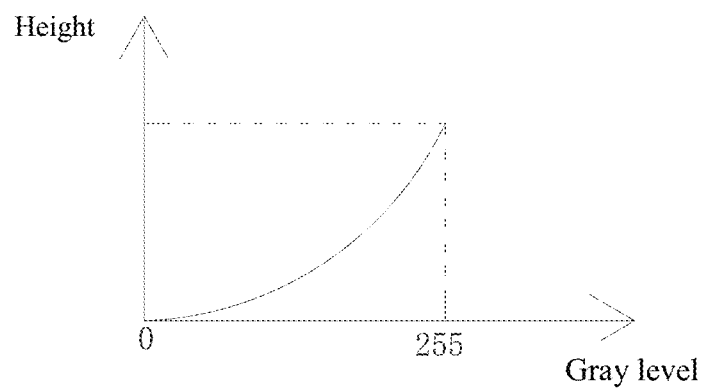
Figure 8D:
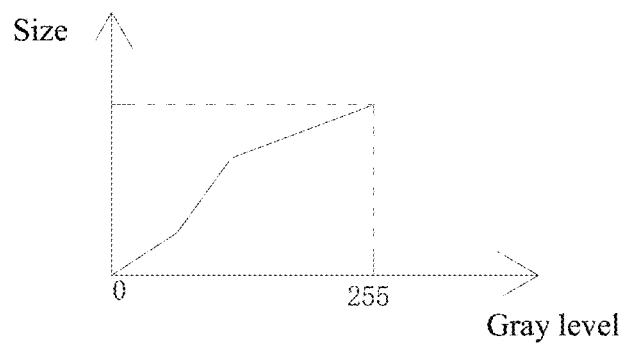
Figure 8E:
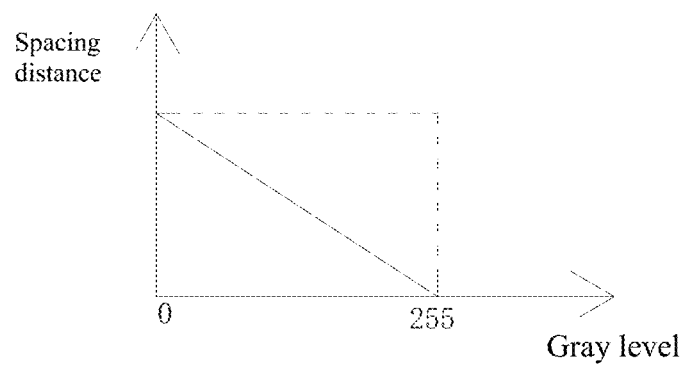
Figure 8F:
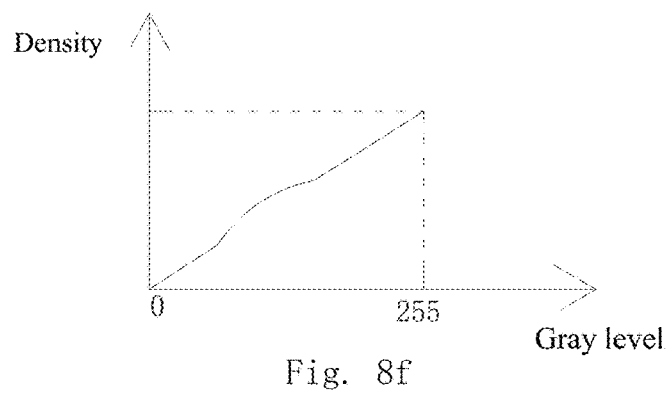
Figure 8G:
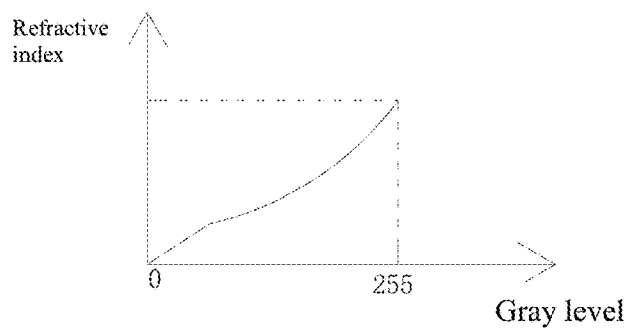

In a preferred embodiment, as shown in FIG. 8a, the gray value of the micro-structure 31 is positively correlated with the angle between it and the horizontal direction, wherein, the gray value is from 0 to 255, and the angle with the horizontal direction is from 0 to 90°. The gray value corresponding to the micro-structure 31 is larger when the angle between the micro-structure 31 and the horizontal direction is larger, and thus the graph-text sub-block 22 comprising the micro-structure 31 is darker. Accordingly, when the angles formed between the micro-structures 31 in at least two graph-text sub-blocks 22 and the horizontal direction are different, a dynamic and continuous image of the three-dimensional material object is obtained.

As shown in FIG. 8, the gray value of the micro-structure 31 is related to the arrangement period of the micro-structures, namely, the gray value of the micro-structure 31 is increased with the increase of the period.

In another preferred embodiment, as shown in FIGS. 10 to 14, the micro-structures 31 are convex structures and/or concave structures. To be specific, the micro-structures 31 can be a lens which comprises a reflective surface. When the micro-structures 31 are convex structures and/or concave structures, the reflective surfaces corresponding thereto are also convex structures and/or concave structures, so that the angles of the reflected light rays of the light rays incident on different reflective surfaces are different.

Figure 10:
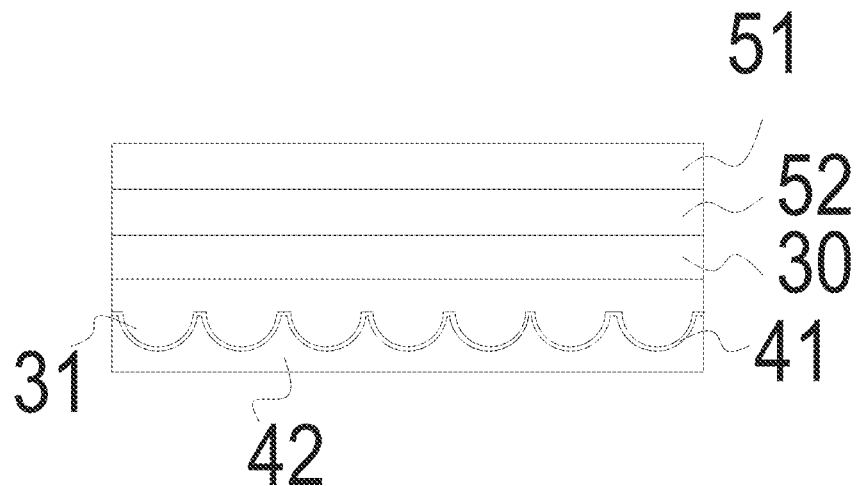
FIG. 10 is a structural diagram of a decorative sheet of the present invention.

In a preferred embodiment, please refer to FIG. 3 in combination with FIG. 10, which is a sectional view of the graph-text structure layer. The graph-text structure layer can be provided between the transparent protective layer 51 and the reflective layer 41. The graph-text structure layer comprises micro-structures 31, and a face of the graph-text structure layer which has the micro-structures 31 is facing towards the transparent protective layer 51, such that the observer can observe the micro-structures 31 through the transparent protective layer 51, and then observe the three-dimensional graphs and text formed by the micro-structures 31.

Continue to refer to FIG. 3. The graph-text structure layer further comprises a bearing body 30 or a substrate material 30. The bearing body 30 or the substrate material 30 has a first surface and a second surface. The micro-structures 31 are provided on the first surface of the bearing body 30 or the substrate material 30. The micro-structures 31 can be provided on the first surface by bonding or integral molding, and can be arranged at predetermined positions on the first surface according to actual graphs and text parameters. The present application is not limited to the above way of setting, and the way of setting the micro-structures 31 can be selected according to actual needs.

Figure 6:
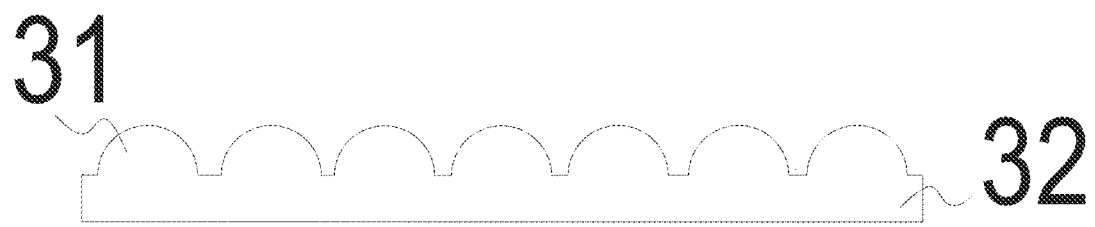
FIG. 6 is another structural diagram of the micro-structure of the present invention.
Figure 7A:
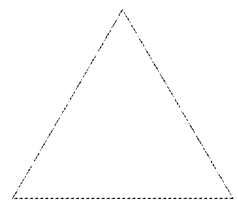
FIGS. 7a~7e are diagrams of the shape and structure of the graph-text sub-block of the present invention.
Figure 7B:
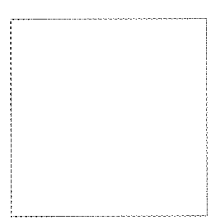
Figure 7C:
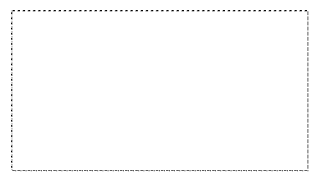
Figure 7D:
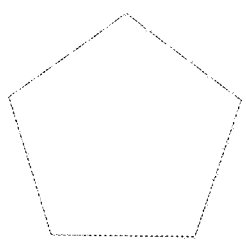
Figure 7E:
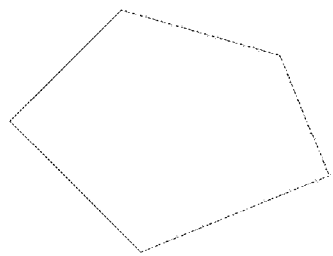

Please refer to FIG. 6, which shows another graph-text structure layer that comprises a polymer layer 32 and micro-structures 31. The micro-structures 31 can be in a convex shape and similar to the micro-structures 31 in FIG. 3. However, the micro-structures 31 in FIG. 6 are integrally structured with the polymer 32 by being directly formed on the polymer 32 by press printing or other means. Preferably, the polymer 32 is a heat curing glue or a light curing glue. The present application does not make any specific limitation to the material of the polymer layer 32.

Figure 4:
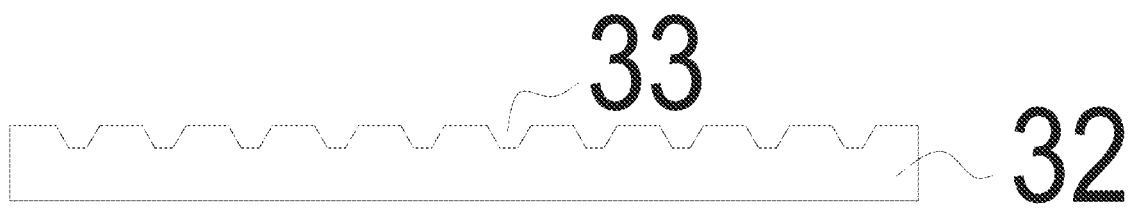
FIG. 4 is another structural diagram of the micro-structure of the present invention.

Please refer to FIG. 4, which shows a sectional view of another graph-text structure layer that comprises the polymer layer 32 and micro-structures 33. The micro-structures 33 can be integrally structured with the polymer layer 32, i.e., can be formed directly on the polymer layer 32 by press printing or other means.

The distinction between FIG. 4 and FIG. 6 lies in the difference of the micro-structures 31. In this embodiment, the micro-structures 31 are in a concave shape, in other words, a width of the bottom of the micro-structure 31 is smaller than a width of its opening, so that the micro-structures are ensured to have a wider and larger reflective surface, thereby allowing light rays to be transmitted at a larger angle and in a larger range.

The functions and effects which the micro-structures 31 and the micro-structures 33 in the above FIGS. 3 and 4 can achieve are the same, both for displaying different gray values. The different reference signs used here are merely for easier description and do not have any special influence to the product structure.

Figure 5:
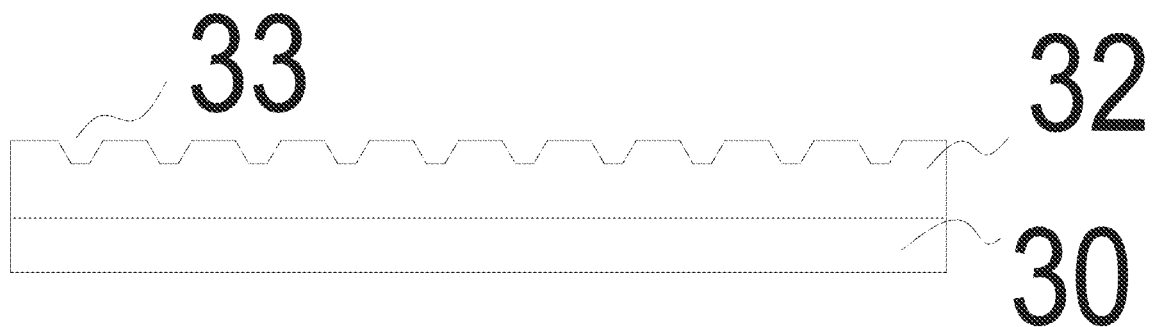
FIG. 5 is another structural diagram of the micro-structure of the present invention.

Please refer to FIG. 5, in which the graph-text structure layer in FIG. 4 is formed on the bearing body 30 or the substrate material 30. To be specific, the polymer layer 32 is provided on a side of the bearing body 30 or the substrate material 30, then concave structures are formed on the polymer layer 32 by press printing or other means, and thereby the micro-structures 33 are formed. A width of the opening of the micro-structure 33 with a concave structure is greater than a width of its bottom, such that the micro-structures are ensured to have a wider and larger reflective surface, thereby allowing light rays to be transmitted at a larger angle and in a larger range.

Please refer to FIG. 10, in a specific embodiment, a decorative sheet comprises a transparent protective layer 51, a bonding layer 52, a bearing body 30 or a substrate material 30, a reflective layer 41 and a coloring layer 42 (or a underlying ink layer). The transparent protective layer 51 comprises a first surface and a second surface disposed opposite to the first surface. The graph-text structure layer and the reflective layer 41 are located on a side of the second surface of the transparent protective layer 51. The micro-structures 31 can be concave structures, wherein a change in lightness and/or color exists among the micro-structures 31, which enables the graphs and text to present a three-dimensional effect. The micro-structures 31 are provided on a side of the polymer 32 and away from a side of the transparent protective layer 51. The reflective layer 41 is provided on the surface of the micro-structures 31, and the coloring layer 42 is provided on the surface of the reflective layer 42. The transparent protective layer 51 is connected with the bearing body or substrate material 30 by means of the bonding layer 52, which, preferably, can be OCA or other transparent colloidal objects.

Figure 11:
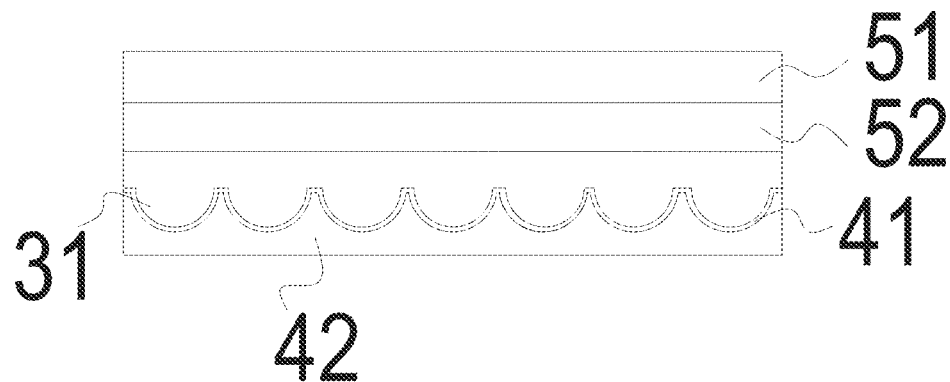
FIG. 11 is another structural diagram of a decorative sheet of the present invention.

Please refer to FIG. 11, in a preferred embodiment, the bonding layer 52 is also provided between the transparent protective layer 51 and the graph-text structure layer. To be specific, this figure shows a structural diagram of a decorative sheet of another structure, which comprises the transparent protective layer 51, the bonding layer 52, the reflective layer 41 and the coloring layer 42, wherein, the graph-text structure layer comprises the polymer layer 32 (not shown in the figure) and the micro-structures 31. The micro-structures 31 are provided on a side of the polymer layer 32 (not shown in the figure) away from the transparent protective layer 51. The reflective layer 41 is provided on the surface of the micro-structures 31. The coloring layer 42 can be provided on the surface of the reflective layer 41. The transparent protective layer 51 is connected with the polymer layer 32 (not shown in the figure) by means of the bonding layer 52, so as to achieve better fitting between the transparent protective layer 51 and the polymer layer. Preferably, the bonding layer 52 can be OCA or other transparent colloidal objects.

Figure 12:
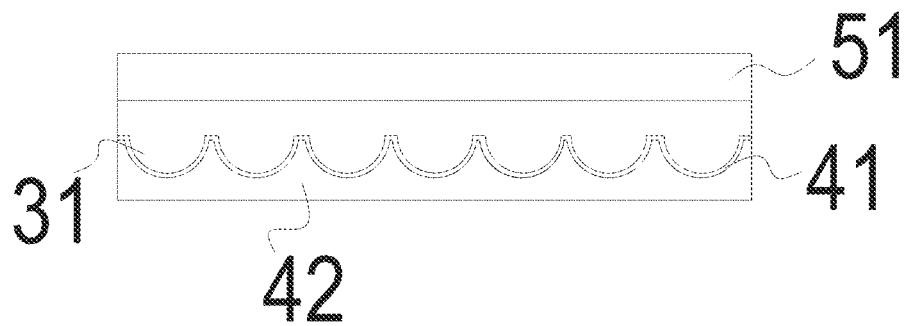
FIG. 12 is another structural diagram of a decorative sheet of the present invention.

Please refer to FIG. 12 in combination with FIG. 11. FIG. 12 shows a structural diagram of another decorative sheet. Compared with FIG. 11, the polymer layer 32 (not shown in the figure) is directly formed on a side of the transparent protective layer 51 without a need of the bonding layer 52. The micro-structures 31 are disposed away from the transparent protective layer 51. Reference can be made to FIG. 11 for the other structures, and no redundant description will be provided here.

Figure 13:
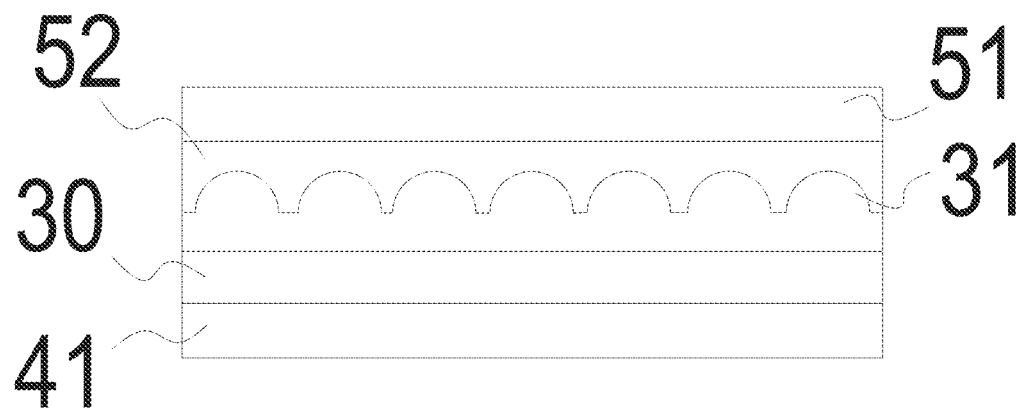
FIG. 13 is another structural diagram of a decorative sheet of the present invention.

Please refer to FIG. 13, which shows a structural diagram of another decorative sheet comprising the transparent protective layer 51, the bonding layer 52, the graph-text structure layer and the reflective layer 41, wherein the graph-text structure layer comprises the bearing body 30 and the polymer layer 32 (not shown in the figure) which is formed on the surface of the bearing body or substrate material 30. The micro-structures 31 are provided on a side of the polymer layer 32 away from the bearing body 30 or the substrate material 30. The micro-structures 31 are oriented towards the transparent protective layer 51 and connected therewith by means of the bonding layer 52. Preferably, if there is no refractive index difference between the bonding layer 52 and the graph-text structure layer, then they are a plane and do not have a variation of light rays, and thus no graph and text would be produced. Therefore, there is a refractive index difference between the bonding layer 52 and the graph-text structure layer, and the refractive index difference is greater than 0.05. Preferably, the reflective layer 41 is located on a side of the bearing body or substrate material 30 away from the polymer layer 32.

Figure 14:
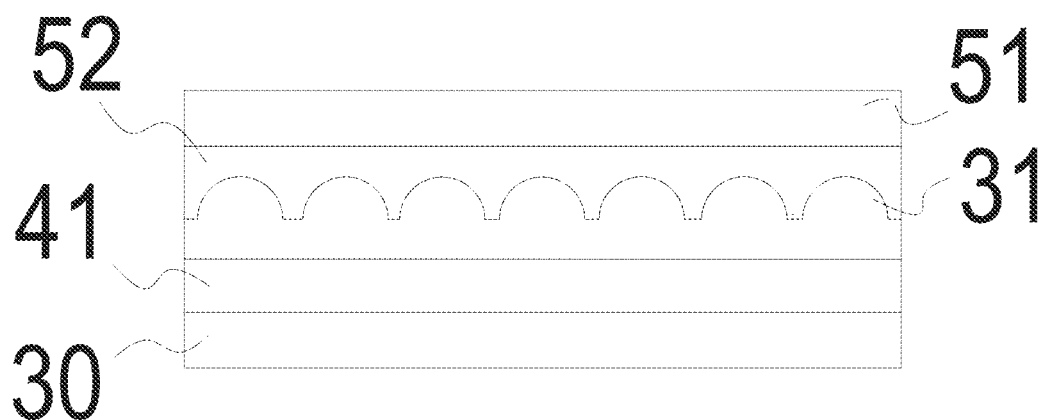
FIG. 14 is another structural diagram of a decorative sheet of the present invention.

Please refer to FIG. 14, in which the position of the reflective layer 41 is adjusted on the basis of the decorative sheet in FIG. 13, and the reflective layer 41 is located between the polymer layer 32 and the bearing body 30 or the substrate material 30.

The transparent protective layer 51 in FIGS. 10 to 14 can be glass, PET, PC and PMMA, etc. Preferably, a hard coat can be provided on a face of the PET, PC and PMMA facing the user, so as to improve the scratch resistance of the transparent protective layer, and thereby improve the service life of the decorative sheet. The bearing body 30 or the substrate material 30 can be a combination of one or several of PET, PC, PMMA and metal.

Figure 15:
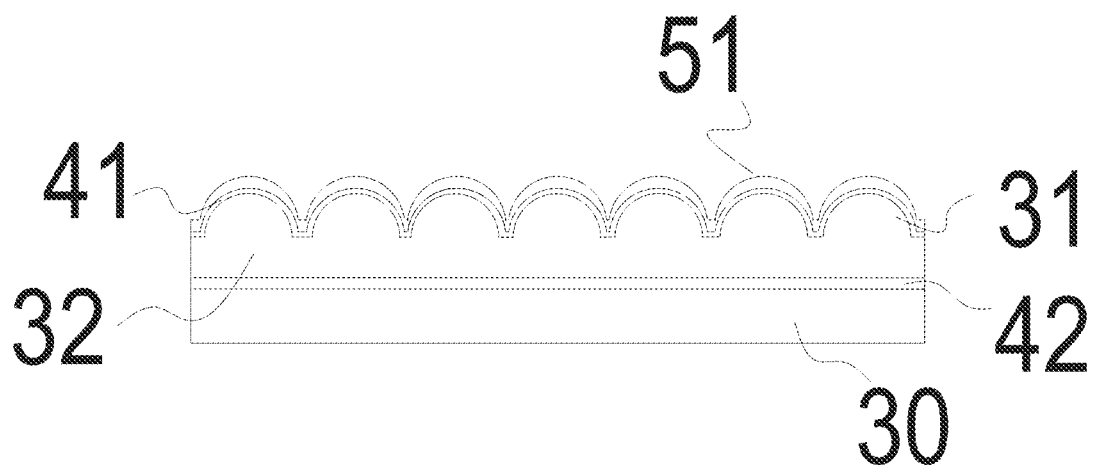
FIG. 15 is another structural diagram of a decorative sheet of the present invention.

Please refer to FIG. 15, which shows a decorative sheet of another structure. The decorative sheet comprises the transparent protective layer 51, the reflective layer 41 and the graph-text structure layer, wherein the graph-text structure layer comprises the bearing body 30 or the substrate material 30, the coloring layer 42 and the polymer layer 32. The coloring layer 42 is provided on the bearing body or substrate material 30. The polymer layer 32 is provided on the coloring layer 42. Micro-structures 31 are provided on a side of the polymer layer 32 away from the coloring layer 42. The reflective layer 41 is provided on the surface of the micro-structures 31. The transparent protective layer 51 is provided on the surface of the reflective layer 41. The transparent protective layer 51 can be a hardened layer or a scratch resisting layer. The surface of the decorative sheet given in FIG. 15 is provide with micro-bumps such that an upper portion of the decorative sheet generates specular reflections, which makes it impossible to see the graphs and text in the decorative sheet clearly, but no, or no obvious bump would be felt when the decorative sheet is touched.

Figure 16:
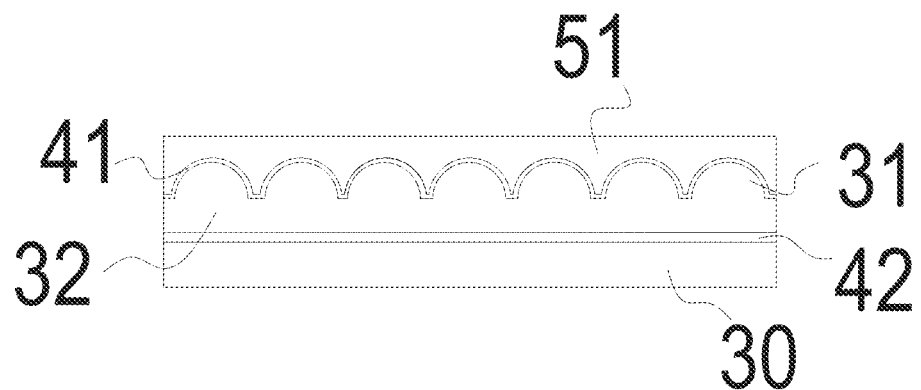
FIG. 16 is another structural diagram of a decorative sheet of the present invention.

Please refer to FIG. 16, which shows a decorative sheet improved according to actual needs on the basis of the decorative sheet in FIG. 15. The distinction is that the transparent protective layer 51 in FIG. 16 is a specular and flat protective structure rather than the transparent protective structure that have bumps in FIG. 15. The present application does not make any specific limitation to the structure of the outer surface of the transparent protective layer 51, which can be selected according to actual needs.

Figure 17:
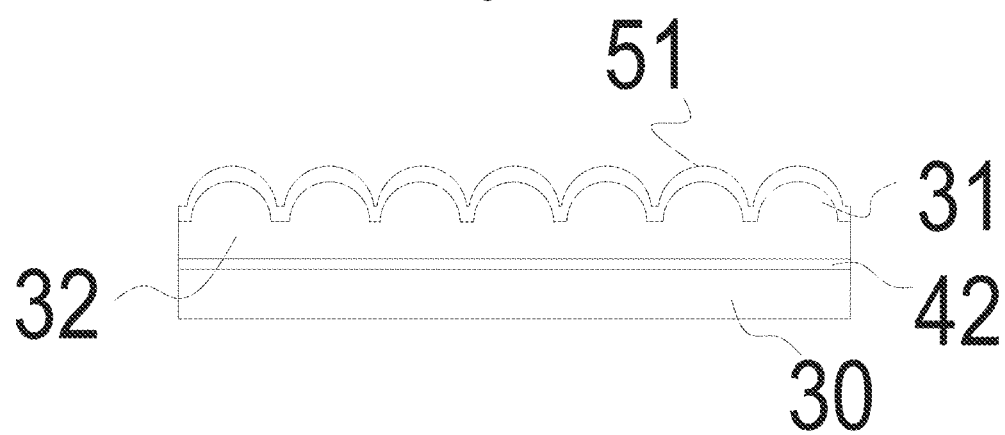
FIG. 17 is another structural diagram of a decorative sheet of the present invention.

Please refer to FIG. 17, which shows a decorative sheet of another structure. The decorative sheet comprises the transparent protective layer 51 and the graph-text structure layer, wherein the graph-text structure layer comprises the bearing body 30 or the substrate material 30, the coloring layer 42 and the polymer layer 32. The coloring layer 42 is provided on the bearing body or substrate material 30. The polymer layer 32 is provided on the coloring layer 42. Micro-structures 31 or micro-structures 33 are provided on a side of the polymer layer 32 away from the coloring layer 42, and the transparent protective layer 51 is provided on the surface of the micro-structures 31 or the micro-structures 33. The transparent protective layer 51 is a hardened layer or a scratch resisting layer.

The bearing body 30 or the substrate material 30 in FIGS. 15 to 17 can also be a metal or metal materials. Preferably, the bearing body 30 or the substrate material 30 itself can also serve as the reflective layer 41 (as shown in FIG. 17).

Figure 18:
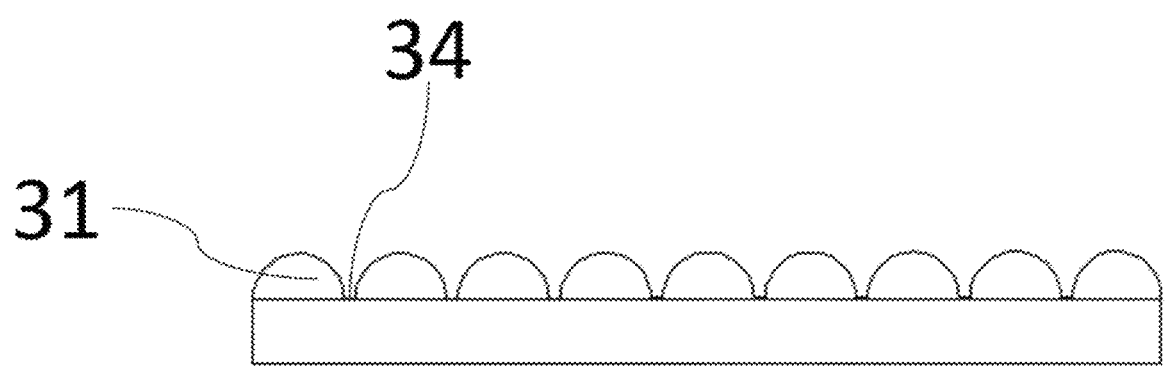
FIG. 18 is a structural diagram of a duty ratio of the micro-structure in a decorative sheet of the present invention.

In this embodiment, a micro-structure region and a blank region are included on the surface of the graph-text sub-block 20. A ratio of the micro-structure region to the blank region is greater than or equal to 1. To be specific, please refer to FIG. 18, in which the micro-structures 31 form the structure region and 34 refers to the blank region. Structure region+Blank region=Whole region. Structure region/Whole region=Duty ratio. The duty ratio is ranged from 50% to 100%. The greater the duty ratio is, the more the micro-structures 31 per unit area will be. The more micro-structures 31 there are, the greater probability and number of the micro-structures 31 observed from different angles by the observer will be, and accordingly, the observation angle at which the observer observes the graphs and text effect will be larger.

Figure 9:
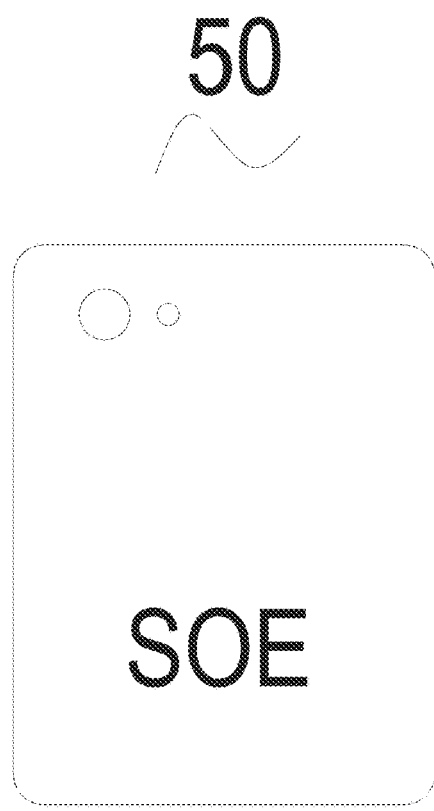
FIG. 9 is a structural diagram of an electronic apparatus cover plate of the present invention.

The present invention also provides an electronic apparatus cover plate, which is provided with any of the above described decorative sheets. Please refer to FIG. 9, in which the cover plate for an electronic apparatus is illustrated. The electronic apparatus cover plate can be provided on an electronic apparatus. The electronic apparatus can be consumer electronics or household appliances. The consumer electronics are cell phones, ipads, laptops, intelligent watches, ipods, cameras, video cameras or intelligent bracelets. FIG. 9 can be a back cover plate of a cell phone or a tablet computer. The back cover plate is provided with holes that match with the camera and letters "SOE". The decorative sheet is adopted in the electronic apparatus cover plate to make it look more beautiful, and the graph-text structure layer in the decorative sheet is formed with graph-text sub-blocks 20. The observer, no matter from what angle he views the decorative sheet, can see the graphs and text clearly. The graphs and text are visually continuous and have a three-dimensional effect. The graphs and text observed by the observer are high-definition graphs and text, which gives the observer a sense of reality, and thereby achieves a good decorative effect.

In order to make the above purpose, features and advantages of the present invention more obvious and easier to be understood, a detailed description of the specific embodiments of the present invention has been made in the above in combination the accompanying drawings. In the above description, a lot of specific details are elaborated for fully understanding the present invention. However, the present invention can be implemented by many other methods different from that mentioned above, thus a person skilled in the art can make similar improvements without violating the connotation of the present invention. Therefore, the present invention is not limited by the above disclosed specific embodiment. In addition, the technical features of the above embodiments can be combined randomly. For simplicity of description, not all possible combinations of the technical features in the above embodiments are described. However, as long as there is no contradiction in the combinations of these technical features, they should be regarded as being within the scope of disclosure contained in the present invention.

It should be understood that the above description is for graphic illustration rather than limitation. By reading the above description, many embodiments and applications other than the provided examples would be obvious for persons skilled in the art. Therefore, the scope of the teaching should be determined not with reference to the above description, but should instead be determined with reference to the appended claims, along with the full scope of equivalents possessed by the claims. The disclosures of all articles and references, including patent applications and publications, are incorporated herein by reference for purpose of being comprehensive. The omission in the foregoing claims of any aspect of the subject matter that is disclosed herein is not a disclaimer of such subject matter, nor should it be regarded that the inventor did not consider such subject matter to be part of the disclosed inventive subject matter.

The invention claimed is:

1. A decorative sheet, for forming a three-dimensional image to represent a three-dimensional material object, wherein the decorative sheet comprises a transparent protective layer, a graph-text structure layer and a reflective layer; the graph-text structure layer and the reflective layer are located on a same side of the transparent protective layer; the graph-text structure layer comprises a number of graph-text sub-blocks which form the three-dimensional image and each of which comprises a micro-structure that represents corresponding lightness of the three-dimensional material object without inks.

2. The decorative sheet according to claim 1, wherein light rays reflected or refracted by the micro-structure to the graph-text sub-block represent the corresponding lightness of the three-dimensional material object.

3. The decorative sheet according to claim 1, wherein each graph-text sub-block represents the corresponding lightness of the three-dimensional material object based on a location of a light source.

4. The decorative sheet according to claim 1, wherein each graph-text sub-block represents the corresponding lightness of the three-dimensional material object based on a location of a receptor.

5. The decorative sheet according to claim 1, wherein the lightness of the image formed by the graph-text structure layer is related to one or a combination of two of a size, a shape, a spacing distance, a period, a height, arrangement density, material and an included angle with a horizontal direction of each graph-text sub-block.

6. The decorative sheet according to claim 1, wherein the lightness of the image formed by the graph-text structure layer is related to a combination of one or more of a size, a spacing distance, a period, a shape, a height, arrangement density, material and an included angle with a horizontal direction of the micro-structure.

7. The decorative sheet according to claim 1, wherein included angles between the micro-structures in at least two graph-text sub-blocks and a horizontal direction are different, and thus a dynamic and continuous image of the three-dimensional material object is obtained.

8. The decorative sheet according to claim 1, wherein the micro-structure is at least one of: a convex structure and a concave structure.

9. The decorative sheet according to claim 8, wherein a setting of plural micro-structures forms the image, and a change among the plural micro-structures represents the lightness change of the image.

10. The decorative sheet according to claim 9, wherein a change in one or more of a size, a shape, a spacing distance, a period, a height, arrangement density, material and an included angle with a horizontal direction of the micro structure represents the lightness of the image.

11. The decorative sheet according to claim 10, wherein a gray value of the three-dimensional material object presented at a predetermined angle corresponds to the setting of the plural micro-structures, one gray value corresponds to one micro-structure, the micro-structures are the same when the gray values are the same, and the micro-structures are different when the gray values are different.

12. The decorative sheet according to claim 1, wherein in a same graph-text sub-block, the graph-text sub-block comprises a plurality of identical micro-structures.

13. The decorative sheet according to claim 1, wherein a maximum radius of the graph-text sub-block is less than 100 µm;
or a maximum radius of the graph-text sub-block is less than 80 µm;
or a maximum radius of the graph-text sub-block is less than 50 µm.

14. The decorative sheet according to claim 1, wherein a cross sectional shape of the graph-text sub-block includes round, triangular, square, rectangular and irregular polygonal shapes;
    or a cross sectional shape of the micro-structure includes round, triangular, square, rectangular and irregular polygonal shapes.

15. The decorative sheet according to claim 1, wherein a spacing distance between two closely adjacent graph-text sub-block is from 0 to 200 μm;
    or a spacing distance between two closely adjacent graph-text sub-block is from 0 to 50 μm.

16. The decorative sheet according to claim 1, wherein the decorative sheet further comprises a bearing layer and a polymer layer disposed on a side of the bearing layer, and the graph-text sub-blocks are provided on the polymer layer.

17. The decorative sheet according to claim 16, wherein the decorative sheet comprises a coloring layer, which is provided between the polymer layer and the bearing layer.

18. An electronic apparatus cover plate, wherein the electronic apparatus cover plate is provided with a decorative sheet according to claim 1.

19. An electronic apparatus, comprising an electronic apparatus cover plate according to claim 18.

20. The electronic apparatus according to claim 19, wherein the electronic apparatus comprises consumer electronics and household appliances.

\* \* \* \* \*

UNITED STATES PATENT AND TRADEMARK OFFICE
CERTIFICATE OF CORRECTION

| | |
|---|---|
| PATENT NO. | : 11,454,742 B2 |
| APPLICATION NO. | : 16/205153 |
| DATED | : September 27, 2022 |
| INVENTOR(S) | : Yulong Gao and Su Shen |

It is certified that error appears in the above-identified patent and that said Letters Patent is hereby corrected as shown below:

On the Title Page

Item (30) should read -- (30) Foreign Application Priority Data: May 31, 2016 (CN) 201610379546.1; and June 01, 2016 (CN) 201610382015.8 --;

In the Claims

In Column 15, Claim 19, Line 23, delete "an" after "comprising" and insert -- the --.

Signed and Sealed this
Tenth Day of January, 2023

Katherine Kelly Vidal
*Director of the United States Patent and Trademark Office*